United States Patent
Wu et al.

(10) Patent No.: US 8,558,262 B2
(45) Date of Patent: Oct. 15, 2013

(54) HIGH-REFLECTION SUBMOUNT FOR LIGHT-EMITTING DIODE PACKAGE AND FABRICATION METHOD THEREOF

(75) Inventors: Shang-Yi Wu, Hsinchu (TW); Chien-Hui Chen, Taoyuan County (TW)

(73) Assignee: Xintec Inc., Jhongli (TW)

( * ) Notice: Subject to any disclaimer, the term of this patent is extended or adjusted under 35 U.S.C. 154(b) by 199 days.

(21) Appl. No.: 13/024,337

(22) Filed: Feb. 10, 2011

(65) Prior Publication Data
US 2011/0198646 A1    Aug. 18, 2011

Related U.S. Application Data

(60) Provisional application No. 61/303,683, filed on Feb. 12, 2010.

(51) Int. Cl.
*H01L 33/00*  (2010.01)
(52) U.S. Cl.
USPC ............................................. 257/98; 257/99

(58) Field of Classification Search
USPC ...................................................... 257/98, 99
See application file for complete search history.

(56) References Cited

U.S. PATENT DOCUMENTS

| 6,531,328 B1* | 3/2003 | Chen ............................. 438/26 |
| 2007/0181905 A1* | 8/2007 | Wang et al. .................. 257/103 |

* cited by examiner

*Primary Examiner* — Douglas Menz
(74) *Attorney, Agent, or Firm* — Liu & Liu (57) ABSTRACT

A method for fabricating a silicon submount for LED packaging. A silicon substrate is provided. A reflection layer is formed on the silicon substrate. Portions of the reflection layer and the silicon substrate are removed to form openings. A wafer backside grinding process is carried out to thin the silicon substrate thereby turning the openings into through silicon vias. An insulating layer is then deposited to cover the reflection layer and the silicon substrate. A seed layer is formed on the insulating layer. A resist pattern is then formed on the seed layer. A metal layer is formed on the seed layer not covered by the resist pattern. The resist pattern is then stripped. The seed layer not covered by the metal layer is then removed.

7 Claims, 13 Drawing Sheets

HIGH-REFLECTION SUBMOUNT FOR LIGHT-EMITTING DIODE PACKAGE AND FABRICATION METHOD THEREOF

CROSS REFERENCE TO RELATED APPLICATIONS

This application claims the priority from U.S. provisional application No. 61/303,683 filed Feb. 12, 2010.

BACKGROUND OF THE INVENTION

1. Field of the Invention

The present invention relates generally to light-emitting diode packaging. More particularly, the present invention relates to high-reflection silicon submounts for light-emitting diode packaging and fabrication method thereof.

2. Description of the Prior Art

As known in the art, a light-emitting diode (LED) is a semiconductor light source. LEDs are used as indicator lamps in many devices, and are increasingly used for lighting. When a light-emitting diode is forward biased (switched on), electrons are able to recombine with holes within the device, releasing energy in the form of photons. LEDs present many advantages over incandescent light sources including lower energy consumption, longer lifetime, improved robustness, smaller size, faster switching, and greater durability and reliability.

In order to achieve the high lumens output and flux density, the LEDs must be driven at high current levels, which in turn results in high levels of heat generation. Special packaging techniques need to be employed to prevent the degradation of LED quantum efficiency, due to temperature increases. However, the conventional ceramic submount or substrate material for LED packaging has unsatisfactory heat dissipating efficiency, hence leading to reliability issue and decrease of LED's lifetime. In addition to the heat dissipation issue, the LED manufacturers are also facing problems such as relatively high production cost and inadequate illumination efficiency.

Therefore, there is a need in this industry to provide an improved LED submount to solve the conventional heat dissipation issue due to the use of ceramic submount, which is also capable of reducing LED production cost and increasing LED illumination efficiency.

SUMMARY OF THE INVENTION

It is one objective of the present invention to provide an improved method for fabricating a high-reflection silicon submount for LED packaging in order to solve the above-mentioned prior art problems.

According to one preferred embodiment of this invention, a method for fabricating a silicon submount for LED packaging is provided. A silicon substrate is prepared. A reflection layer is formed on the silicon substrate. Portions of the reflection layer and the silicon substrate are removed to form openings. A wafer backside grinding process is carried out to thin the silicon substrate thereby turning the openings into through silicon vias. An insulating layer is then deposited to cover the reflection layer and the silicon substrate. A seed layer is formed on the insulating layer. A resist pattern is then formed on the seed layer. A metal layer is formed on the seed layer not covered by the resist pattern. The resist pattern is then stripped. The seed layer not covered by the metal layer is then removed.

According to one preferred embodiment of this invention, a method for fabricating a silicon submount for LED packaging is provided. A silicon substrate is prepared. A reflection layer is formed on the silicon substrate. A portion of the reflection layer and the silicon substrate is etched away to form an opening. A wafer backside grinding process is performed to thin the silicon substrate, thereby turning the opening into a through silicon via. An insulating layer covering the reflection layer and silicon substrate is formed. A metal seed layer covering the insulating layer is formed. A photoresist pattern is formed on the insulating layer to define a redistribution layer pattern. A portion of the metal seed layer not covered with the photoresist pattern is etched away to expose a portion of the insulating layer. The photoresist pattern is removed after etching the metal seed layer. A metal layer is electroplated on the metal seed layer.

According to still another preferred embodiment of this invention, a silicon submount for LED package is provided. The silicon submount includes a silicon substrate having a reflection layer disposed on one side of the silicon substrate; a through silicon via penetrating through the reflection layer and the silicon substrate; an insulating layer covering the reflection layer and the silicon substrate; and a redistribution layer on the insulating layer.

According to yet another preferred embodiment of this invention, an LED package is provided. The LED package includes a silicon submount; an LED die mounted on the silicon submount; and a bond wire, electrically connecting an electrode of the LED die to a bonding pad of the silicon submount. The silicon submount includes a silicon substrate having a reflection layer disposed on one side of the silicon substrate; a through silicon via penetrating through the reflection layer and the silicon substrate; an insulating layer covering the reflection layer and the silicon substrate; and a redistribution layer on the insulating layer These and other objectives of the present invention will no doubt become obvious to those of ordinary skill in the art after reading the following detailed description of the preferred embodiment that is illustrated in the various figures and drawings.

DETAILED DESCRIPTION

The invention pertains to a method of fabricating a silicon submount for light emitting device package, which can be incorporated into the wafer level chip scale package (WLCSP) processes. In one embodiment, the light emitting device package structure may be fabricated using a WLCSP process to package a light emitting device, for example, a light emitted diode (LED) or laser diode (LD). The wafer level chip scale package process mentioned above mainly means that after the package process is accomplished during the wafer stage, the wafer with chips is cut to obtain separate independent packages.

However, in an embodiment of the invention, separate independent chips may be redistributed overlying a supporting wafer serving as a carrier and then be packaged, which may also be referred to as a wafer scale package process. In addition, the above mentioned wafer scale package process may also be adapted to form electronic device packages of multi-layer integrated circuit devices by stacking a plurality of wafers having integrated circuits.

It is another technical feature of the invention that the fabrication of the silicon submount incorporates through silicon via (TSV) technology.

Figure 1:
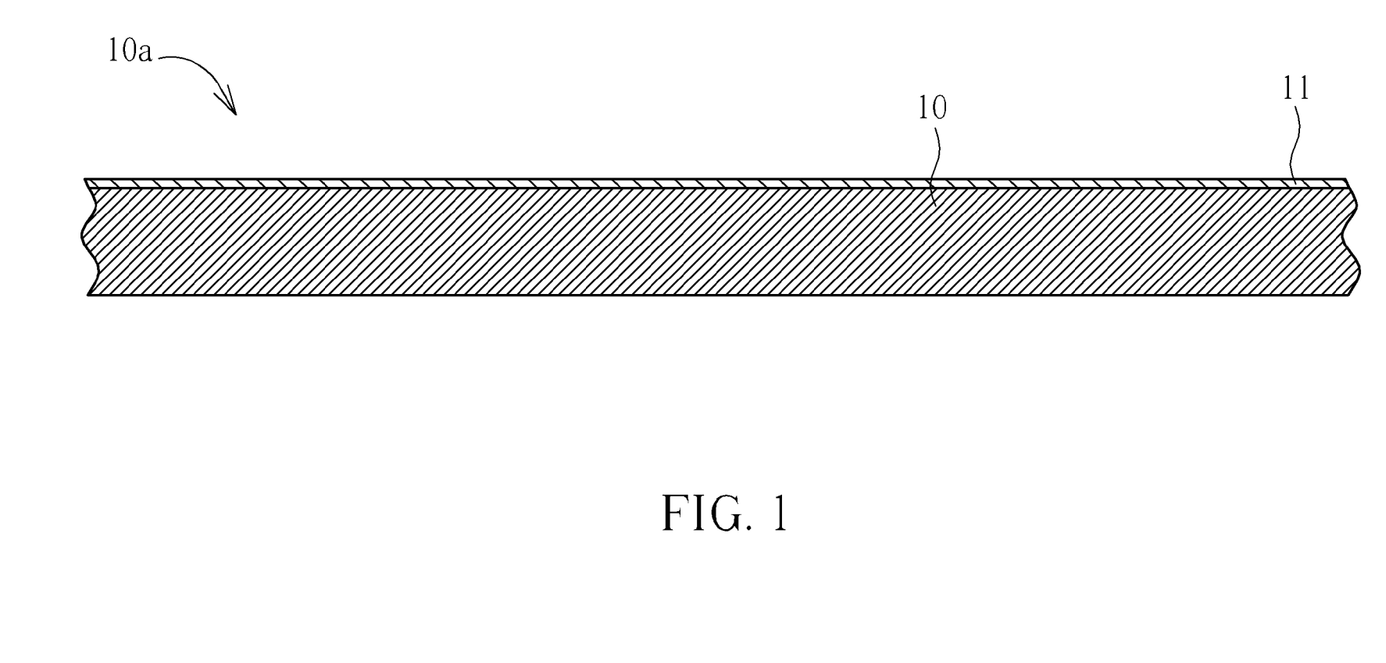
FIG. 1 to FIG. 6 are schematic, cross-sectional diagrams showing an exemplary method for fabricating a silicon submount for LED packaging in accordance with one preferred embodiment of this invention.

FIG. 1 to FIG. 6 are schematic, cross-sectional diagrams showing an exemplary method for fabricating a silicon submount for LED packaging in accordance with one preferred embodiment of this invention. As shown in FIG. 1, a silicon wafer or silicon substrate 10 such as a single crystalline silicon wafer or substrate having (100) crystal orientation. A sputtering process is then carried out to form a reflection layer 11 merely on the front side 10a of the silicon substrate 10. For example, the reflection layer 11 may be composed of aluminum or silver, preferably aluminum. It is to be understood that the aforesaid reflection layer 11 may be formed by other processes other than sputtering, for example, electroplating, physical vapor deposition (PVD), chemical vapor deposition (CVD) or atomic layer deposition (ALD) process.

Figure 2:
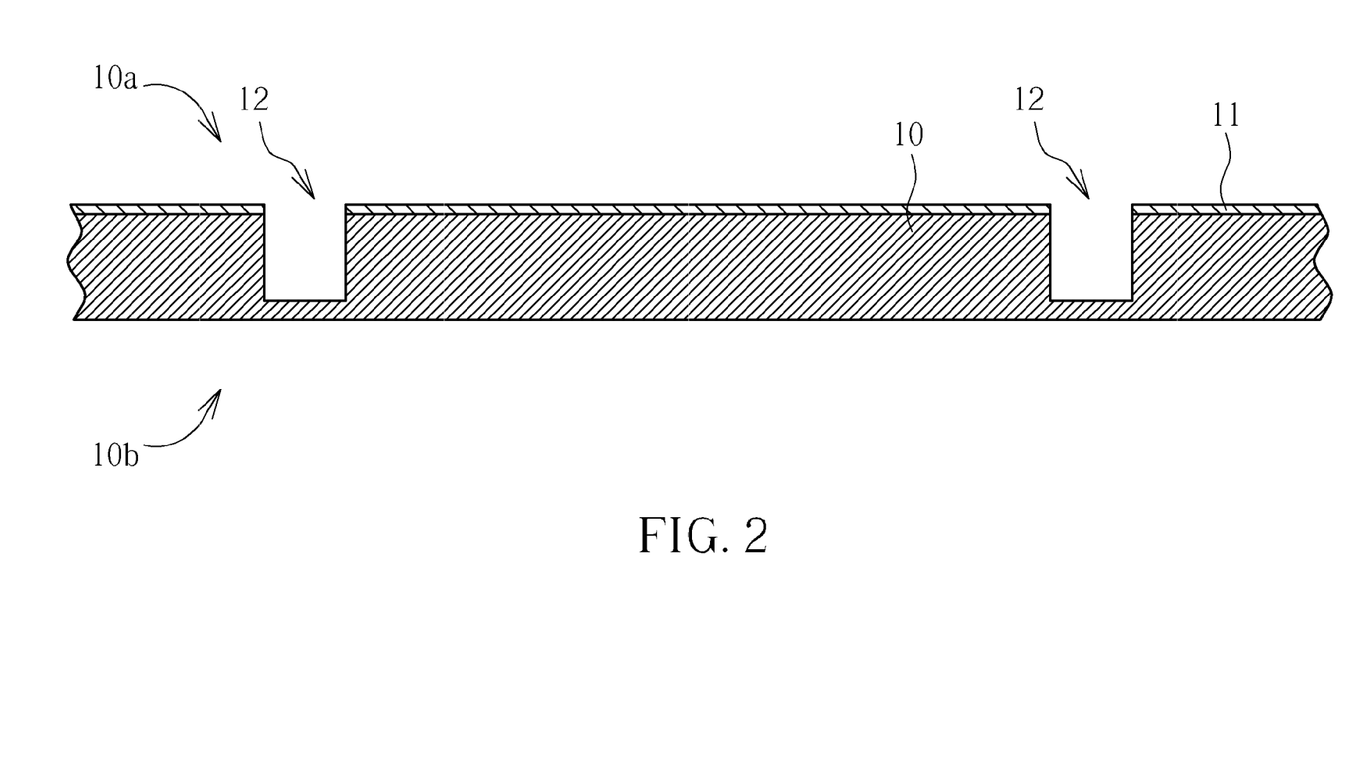

As shown in FIG. 2, subsequently, a lithographic process and an etching process are carried out to etch away a portion of the reflection layer 11 and the silicon substrate 10, thereby forming openings 12. Each of the openings 12 is substantially in the position where the through silicon via (TSV) to be formed. For example, the aforesaid lithographic process includes forming a photoresist layer (not shown) on the reflection layer 11, subjecting the photoresist layer to exposure and development processes, thereby transferring the mask pattern that defines the pattern of TSV onto the photoresist layer, then performing an etching process to remove the reflection layer 11 not covered with the patterned photoresist layer, then etching the silicon substrate 10 to a predetermined depth, and thereafter stripping the remaining photoresist layer.

Figure 3:
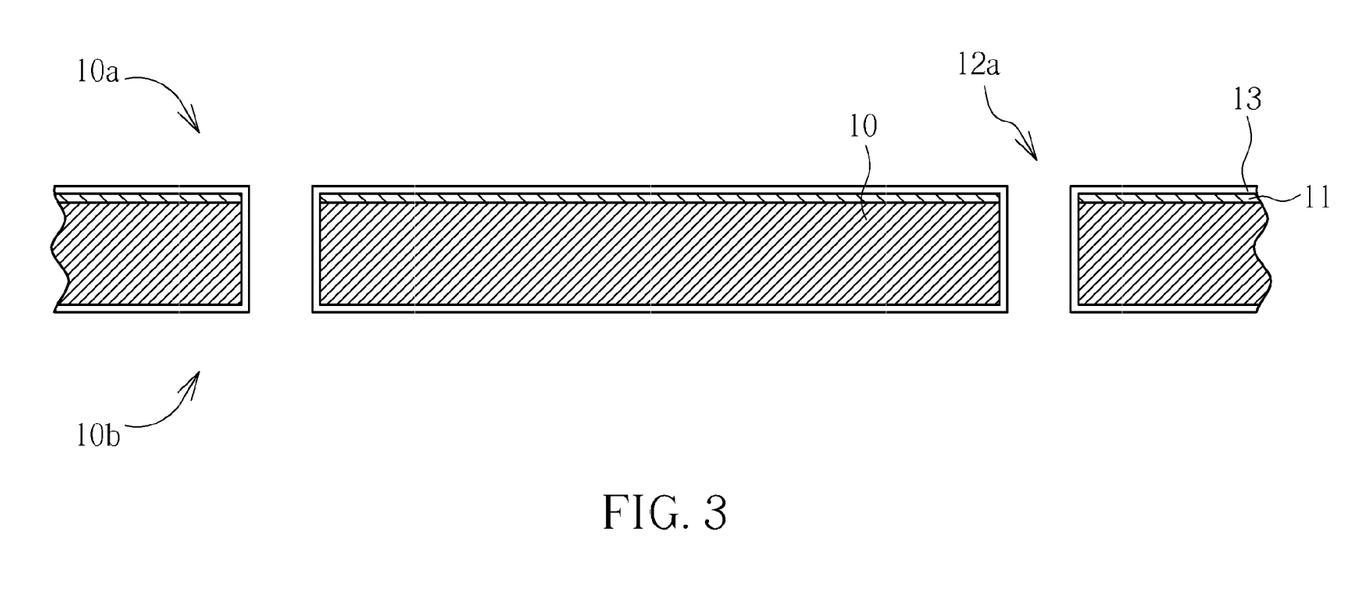

As shown in FIG. 3, a wafer backside grinding process is carried out to polish and thin the silicon substrate 10 from the backside 10b of the silicon substrate 10, thereby turning the openings 12 into through silicon vias (TSVs) 12a. Subsequently, a deposition process such as a chemical vapor deposition (CVD) process is performed to form a transparent insulating layer 13 such as silicon dioxide on the front side 10a and backside 10b of the silicon substrate 10, on the reflection layer 11 and on the sidewall of each of the TSVs 12a.

Figure 4:
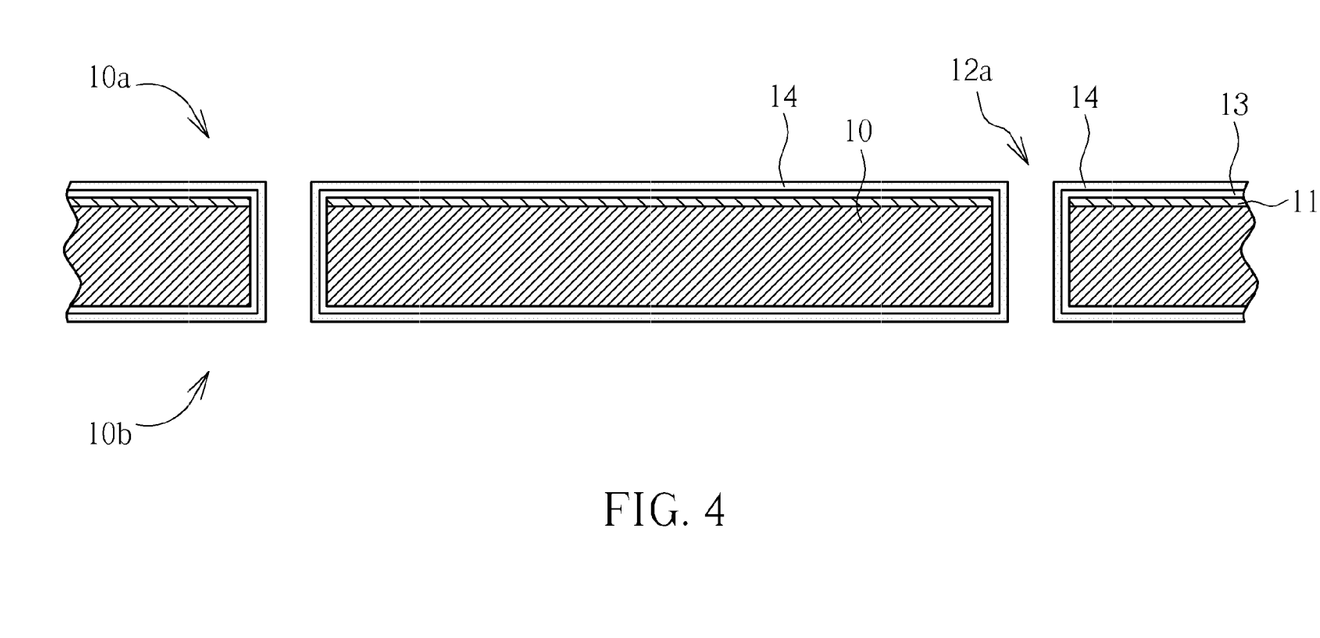

As shown in FIG. 4, a physical vapor deposition (PVD) process is performed to form a metal seed layer 14 such as copper seed layer on the insulating layer 13 on the front side 10a and backside 10b of the silicon substrate 10, and on the insulating layer 13 within each of the TSVs 12a. The metal seed layer 14 may comprise TiW and Cu. The reflection layer 11 is insulated from the metal seed layer by the insulating layer 13.

Figure 5:
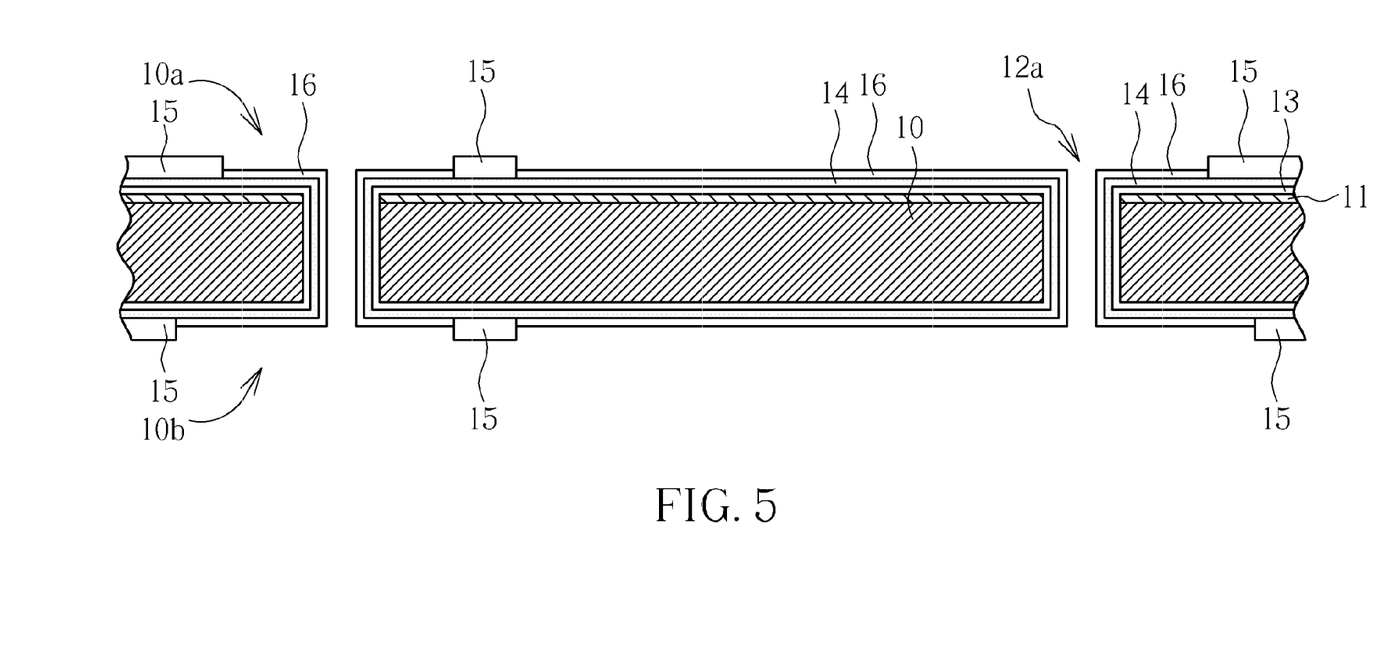

As shown in FIG. 5, a photoresist pattern 15 is then formed on the metal seed layer 14 on the front side 10a and backside 10b of the silicon substrate 10. The photoresist pattern 15 defines a redistribution layer (RDL) pattern. Subsequently, an electroplating process is performed to form a metal layer 16 on the metal seed layer 14 not covered with the photoresist pattern 15. The metal layer 16 may comprise copper and nickel/gold layer on the copper layer.

Figure 6:
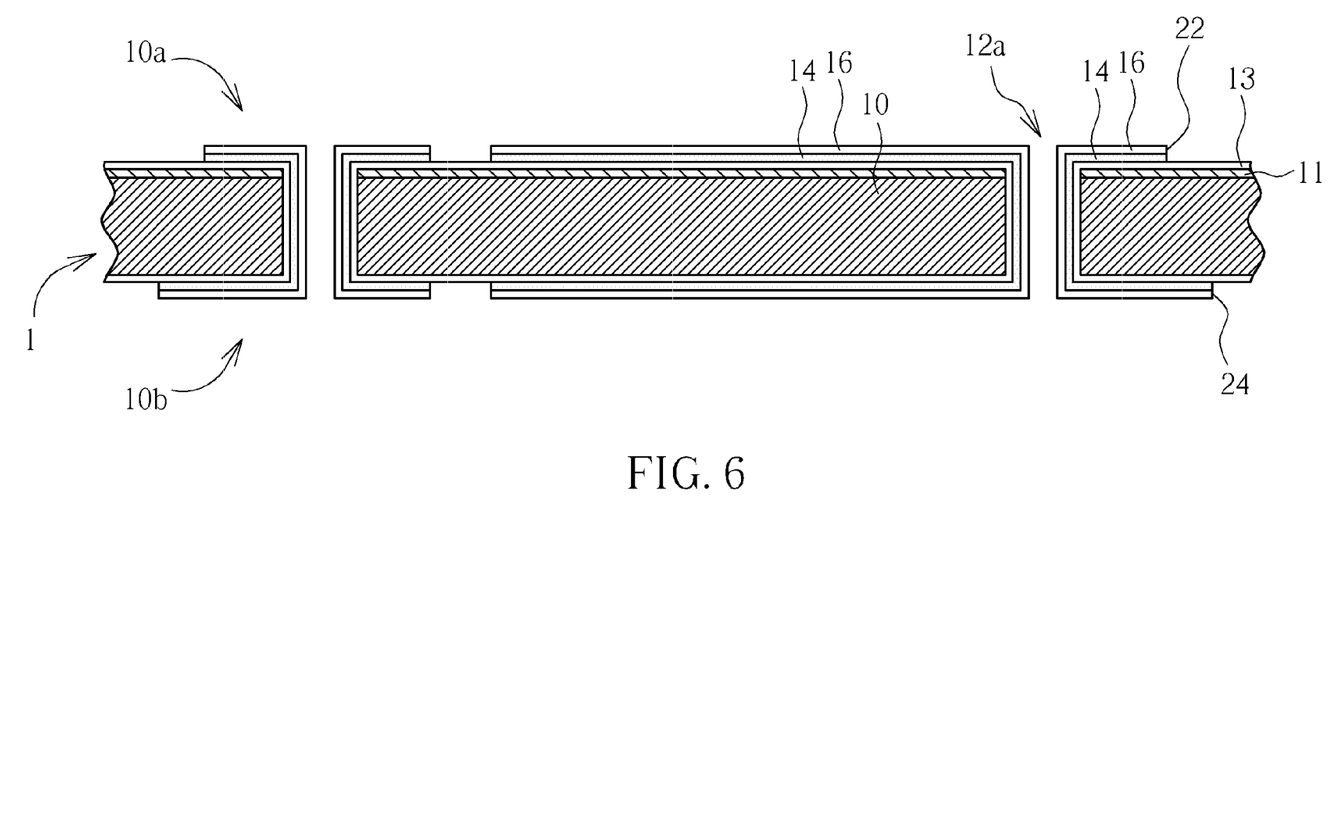

As shown in FIG. 6, the photoresist pattern 15 is removed to reveal a portion of the metal seed layer 14. Thereafter, the exposed metal seed layer 14 is etched away to reveal a portion of the insulating layer 13, thereby completing the fabrication of the high-reflection silicon submount 1. A redistribution layer 22 is formed on the insulating layer 13 on the front side 10a of the silicon substrate 10 and a redistribution layer 24 is formed on the insulating layer 13 on the backside 10b of the silicon substrate 10. The redistribution layer 22 is electrically connected to the redistribution layer 24 through the TSVs 12a. A light emitting device (not shown) may be surface mounted on the front side 10a of the silicon substrate 10 and may be electrically connected to the redistribution layer 22 by wire bonding.

It is one advantage of the present invention that the reflection layer 11 can increase the light utilization efficiency by 3-5%. Besides, the heat dissipating efficiency of the silicon substrate is better than that of the ceramic substrates. Further, the production cost is reduced because the fabrication process for making the silicon submount that incorporates the TSV technology is simplified. For example, the reflection layer and the TSVs can be defined using one single mask.

FIG. 7 to FIG. 12 are schematic, cross-sectional diagrams showing an exemplary method for fabricating a silicon submount for LED packaging in accordance with another preferred embodiment of this invention, wherein like numeral numbers designate like elements, layers and regions.

Figure 7:
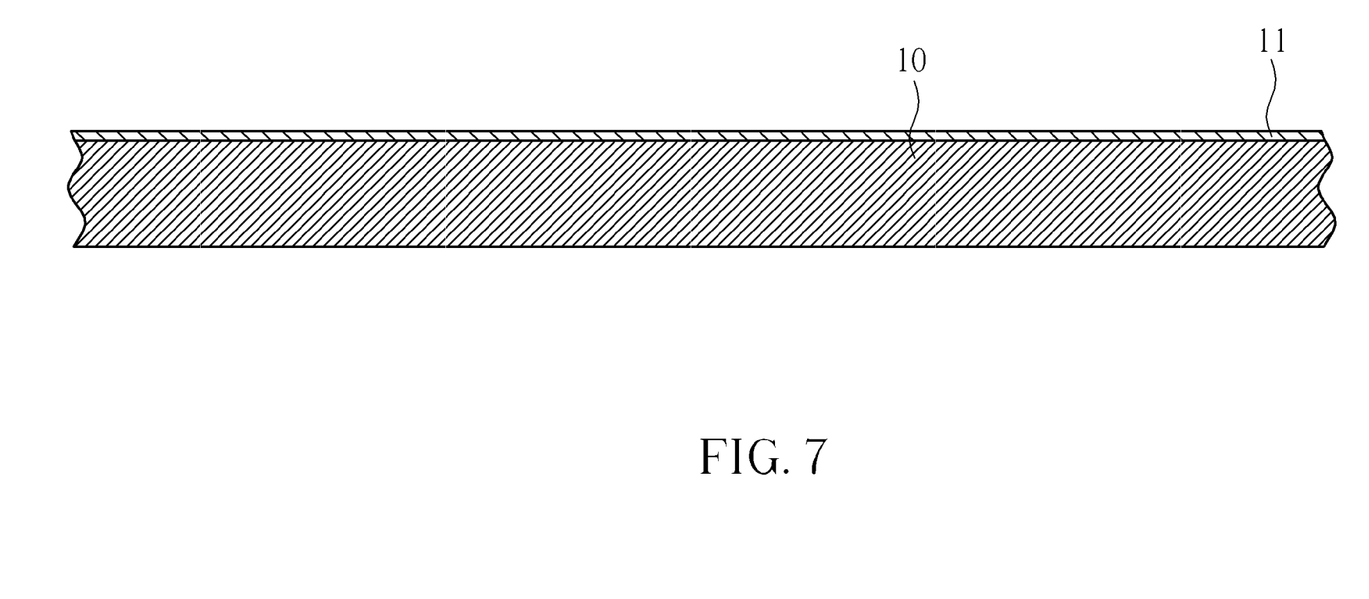
FIG. 7 to FIG. 12 are schematic, cross-sectional diagrams showing an exemplary method for fabricating a silicon submount for LED packaging in accordance with another preferred embodiment of this invention.

As shown in FIG. 7, likewise, a silicon wafer or silicon substrate 10 such as a single crystalline silicon wafer or substrate having (100) crystal orientation. A sputtering process is then carried out to form a reflection layer 11 merely on the front side 10a of the silicon substrate 10. For example, the reflection layer 11 may be composed of aluminum or silver, preferably aluminum. It is to be understood that the aforesaid reflection layer 11 may be formed by other processes other than sputtering, for example, electroplating, physical vapor deposition (PVD), chemical vapor deposition (CVD) or atomic layer deposition (ALD) process.

Figure 8:
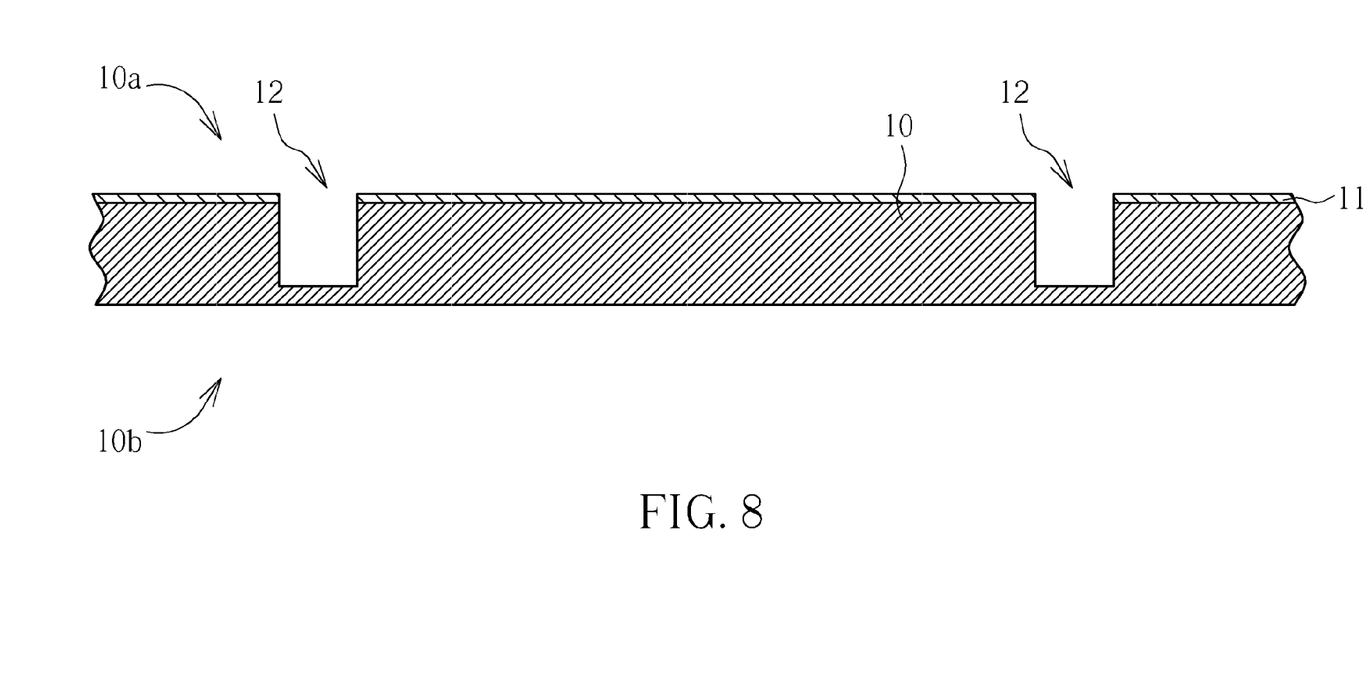

As shown in FIG. 8, subsequently, a lithographic process and an etching process are carried out to etch away a portion of the reflection layer 11 and the silicon substrate 10, thereby forming openings 12. Each of the openings 12 is substantially in the position where the through silicon via (TSV) to be formed. For example, the aforesaid lithographic process includes forming a photoresist layer (not shown) on the reflection layer 11, subjecting the photoresist layer to exposure and development processes, thereby transferring the mask pattern that defines the pattern of TSV onto the photoresist layer, then performing an etching process to remove the reflection layer 11 not covered with the patterned photoresist layer, then etching the silicon substrate 10 to a predetermined depth, and thereafter stripping the remaining photoresist layer.

Figure 9:
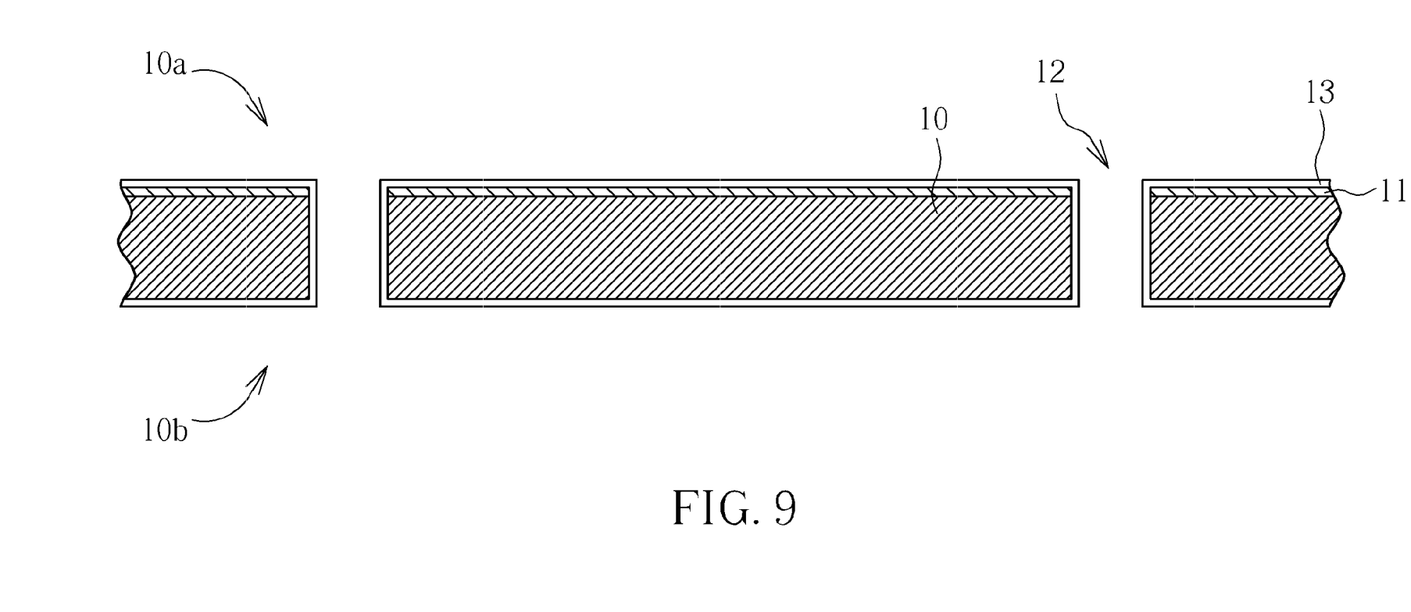

As shown in FIG. 9, a wafer backside grinding process is carried out to polish and thin the silicon substrate 10 from the backside 10b of the silicon substrate 10, thereby turning the openings 12 into through silicon vias (TSVs) 12a. Subsequently, a deposition process such as a chemical vapor deposition (CVD) process is performed to form a transparent insulating layer 13 such as silicon dioxide on the front side 10a and backside 10b of the silicon substrate 10, on the reflection layer 11 and on the sidewall of each of the TSVs 12a.

Figure 10:
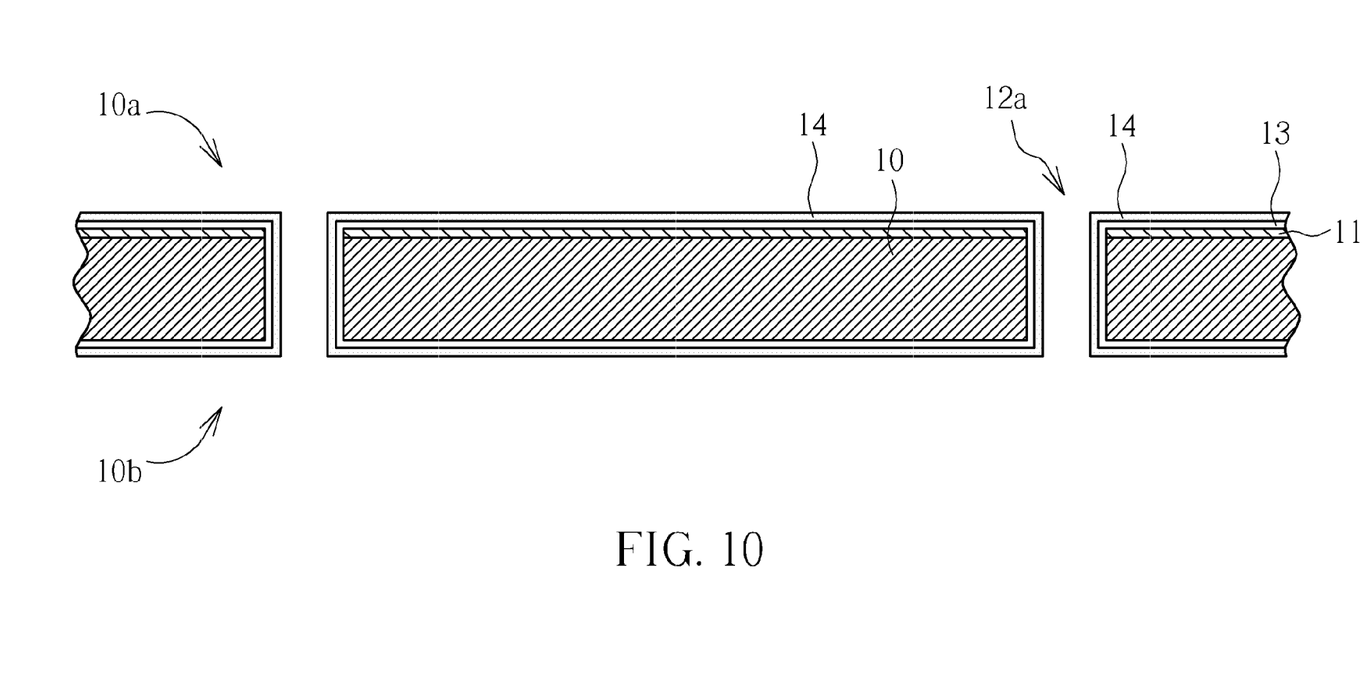

As shown in FIG. 10, a physical vapor deposition (PVD) process is performed to form a metal seed layer 14 such as copper seed layer on the insulating layer 13 on the front side 10a and backside 10b of the silicon substrate 10, and on the insulating layer 13 within each of the TSVs 12a. The metal seed layer 14 may comprise TiW and Cu. The reflection layer 11 is insulated from the metal seed layer by the insulating layer 13.

Figure 11:
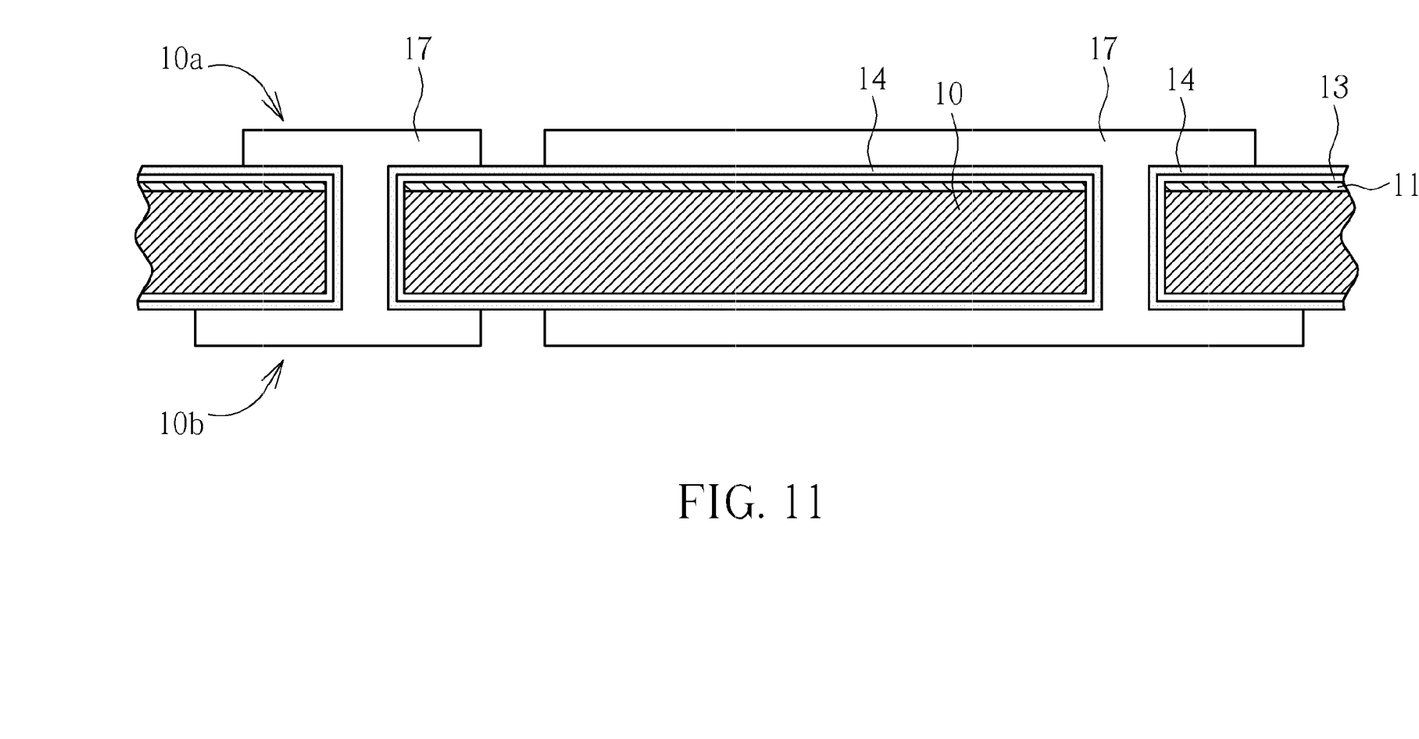

As shown in FIG. 11, a photoresist pattern 17 is formed on the metal seed layer 14 on the front side 10a of the silicon substrate 10 and on the metal seed layer 14 on the backside 10b of the silicon substrate 10. The photoresist pattern 17 defines the redistribution layer pattern. Subsequently, the metal seed layer 14 not covered with the photoresist pattern 17 is etched away, thereby exposing a portion of the insulating layer 13. The photoresist pattern 17 is then stripped.

Figure 12:
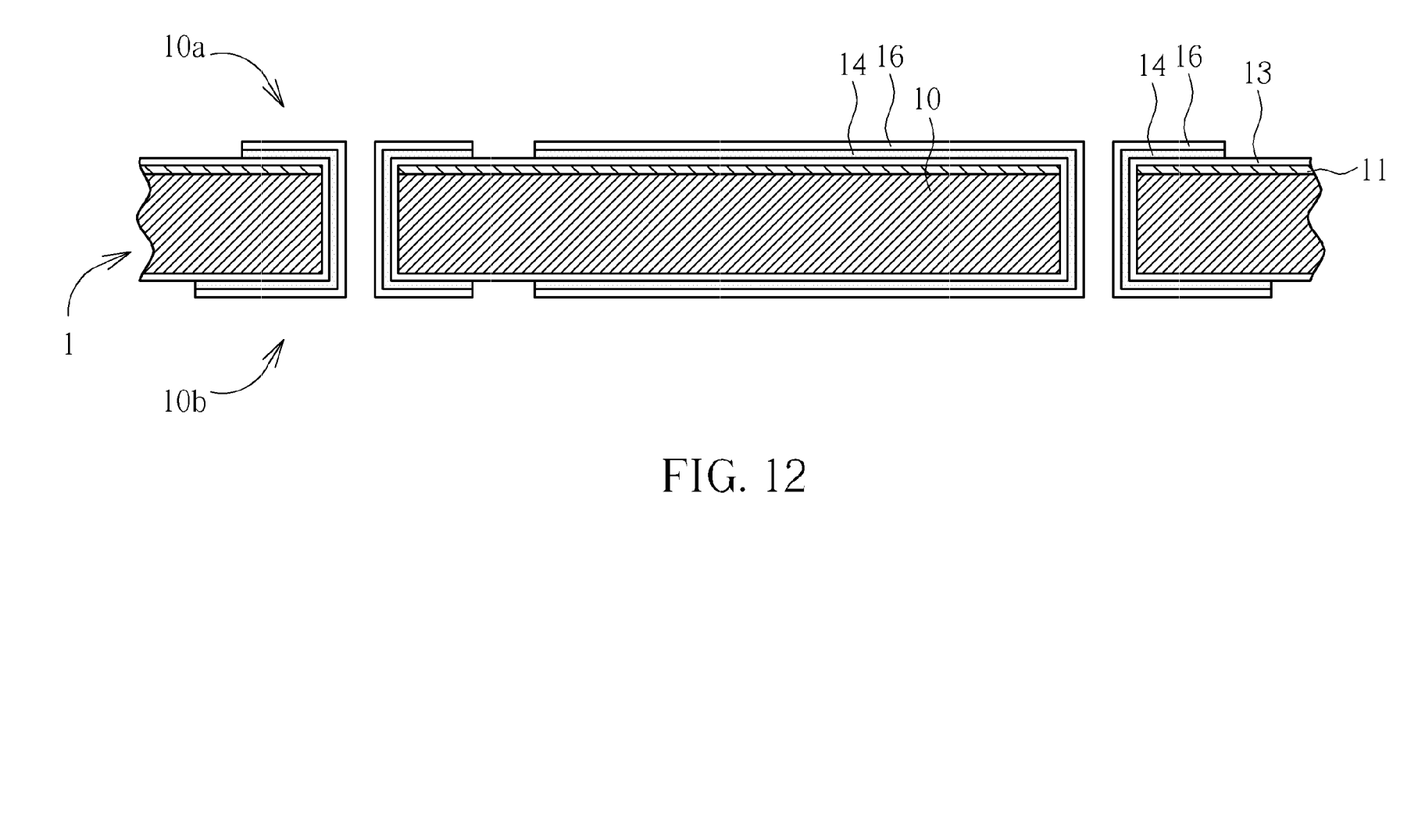

As shown in FIG. 12, an electroplating process is performed to form a metal layer 16 on the metal seed layer 14. The metal layer 16 may comprise copper and nickel/gold layer on the copper layer.

Figure 13:
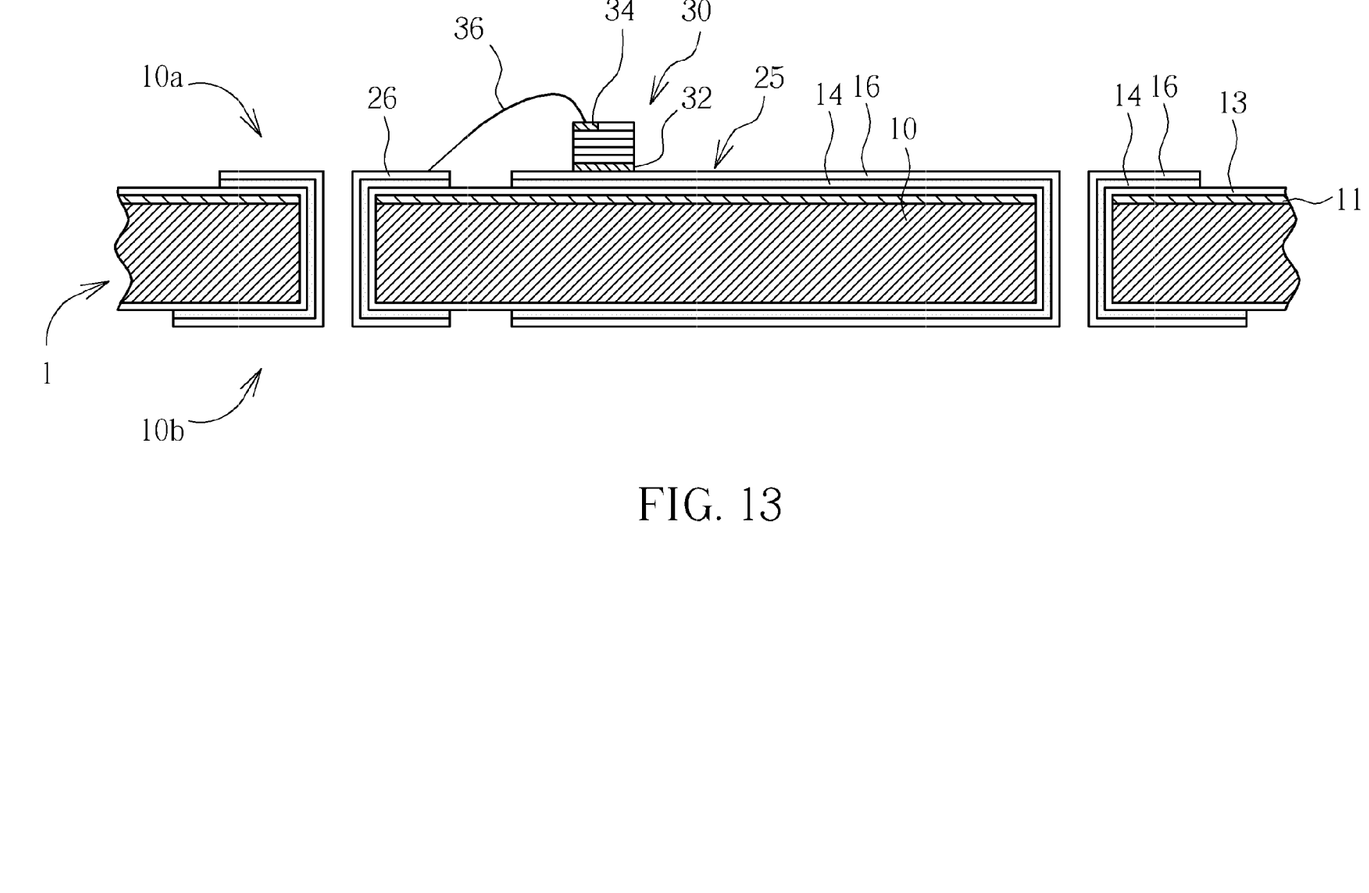
FIG. 13 is a schematic, cross-sectional diagram showing an LED package in accordance with another embodiment of this invention.

FIG. 13 is a schematic, cross-sectional diagram showing an LED package in accordance with another embodiment of this invention. As shown in FIG. 13, after the formation of the high-reflection silicon submount 1 as described above, an LED die 30 is surface mounted on the die pad 25 on the silicon submount 1. The LED die 30 may comprise a first electrode 32 and a second electrode 34. The first electrode 32 is electrically connected to the die pad 25. The second electrode 34 is electrically connected to a bonding pad 26 on the high-reflection silicon submount 1 through bond wire 36.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A silicon submount for LED package, comprising:
    a silicon substrate having a reflection layer disposed on one side of the silicon substrate;
    a through silicon via penetrating through the reflection layer and the silicon substrate;
    an insulating layer covering the reflection layer and the silicon substrate; and
    a redistribution layer on the insulating layer.

2. The silicon submount for LED package according to claim 1 wherein the reflection layer comprises aluminum or silver.

3. The silicon submount for LED package according to claim 1 wherein the insulating layer is a transparent insulating layer.

4. The silicon submount for LED package according to claim 1 wherein the redistribution layer comprises a metal seed layer and a metal layer.

5. The silicon submount for LED package according to claim 4 wherein the metal seed layer comprises TiW or copper.

6. The silicon submount for LED package according to claim 4 wherein the metal layer comprises copper or a nickel layer.

7. An LED package, comprising:
    a silicon submount according to claim 1;
    an LED die mounted on the silicon submount; and
    a bond wire, electrically connecting an electrode of the LED die to a bonding pad of the silicon submount.

* * * * *